US006740905B1

(12) United States Patent
Kaya et al.

(10) Patent No.: US 6,740,905 B1
(45) Date of Patent: May 25, 2004

(54) APPARATUS FOR SUPPRESSING CROSSTALK IN IMAGE SENSORS WITHOUT DEGRADING RED LIGHT RESPONSE

(75) Inventors: Cetin Kaya, Plano, TX (US); Sreenath Unnikrishnan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/292,150

(22) Filed: Nov. 12, 2002

(51) Int. Cl.[7] .............................................. H01L 33/00
(52) U.S. Cl. .................... 257/89; 257/59; 257/291; 257/292; 438/70; 438/73
(58) Field of Search ........................... 257/59, 89, 232, 257/292, 440, 291; 438/70, 73

(56) References Cited

U.S. PATENT DOCUMENTS 6,365,916 B1 * 4/2002 Zhong et al. .................. 257/59
6,518,085 B1 * 2/2003 Wang et al. ................... 438/70
6,548,833 B1 * 4/2003 Lin et al. ....................... 257/89

* cited by examiner

*Primary Examiner*—David Nelms
*Assistant Examiner*—Dao H. Nguyen
(74) *Attorney, Agent, or Firm*—Alan K. Stewart; W. James Brady, III; Frederick J. Telecky, Jr.

(57) ABSTRACT

The image sensor has improvements for suppressing cross talk without degrading red light response. This is accomplished by implanting a deep p+ layer 42 under blue and green pixels 24 and 22 but not under red pixels 20 in a standard RGB pattern color filter array.

7 Claims, 3 Drawing Sheets

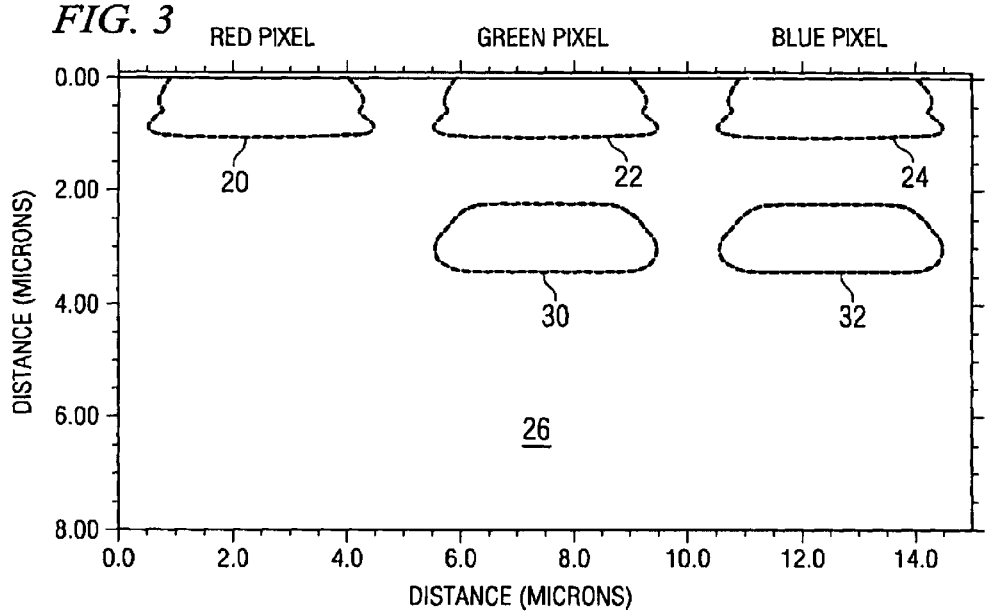
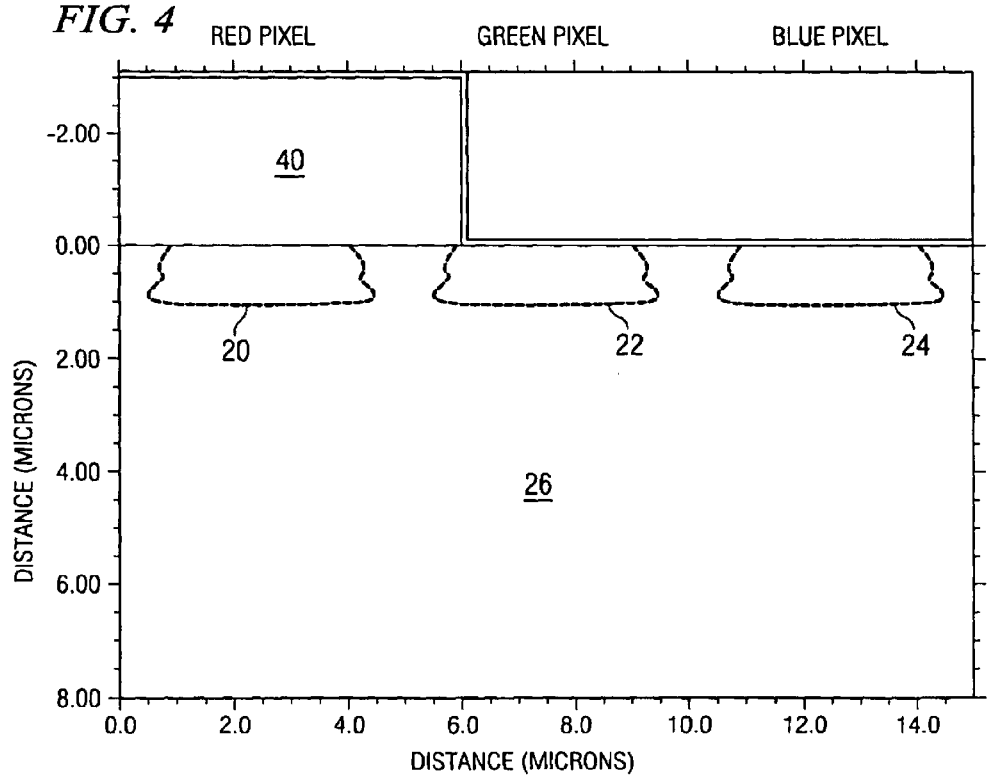

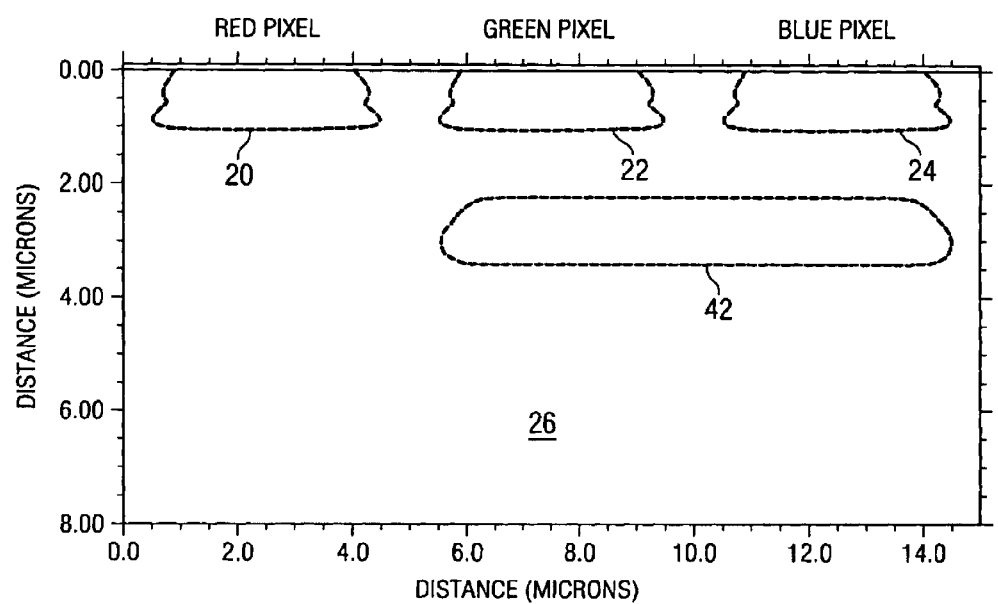

APPARATUS FOR SUPPRESSING CROSSTALK IN IMAGE SENSORS WITHOUT DEGRADING RED LIGHT RESPONSE

FIELD OF THE INVENTION

This invention generally relates to electronic systems and in particular it relates to semiconductor image sensing devices.

BACKGROUND OF THE INVENTION

Cross talk is a phenomenon that degrades the resolution of CMOS imagers at longer wavelength. Degradation in resolution manifests itself as blurring or reduction in contrast.

The origin of cross talk is the diffusion of photo-generated electrons from the neighboring pixels (receiving light stimulus) to pixels that are not supposed to receive light stimulus. Cross talk increases with incident light wavelength. This is due to the fact that: (1) longer wavelengths are absorbed deeper in the silicon, and (2) isotropic diffusion process from the absorption point looses the spatial information on light source.

SUMMARY OF THE INVENTION

An image sensor with improvements for suppressing cross talk without degrading red light response. This is accomplished by implanting a deep p+ layer under blue and green pixels but not under red pixels in a standard RGB pattern color filter array.

BRIEF DESCRIPTION OF THE DRAWINGS

In the drawings:

FIGS. 1–3 show a cross-section of three pixels of a first preferred embodiment image sensor at three stages of fabrication.

FIGS. 4 and 5 show a cross-section of three pixels of a second preferred embodiment image sensor at two stages of fabrication.

DETAILED DESCRIPTION OF PREFERRED EMBODIMENTS

The preferred embodiments, described below, introduce a method of suppressing cross talk in image sensors without degrading red light response. This is accomplished by implanting a deep p+ layer under blue and green pixels but not under red pixels in a standard RGB pattern color filter array shown below:

RGRGRGRGRGRG
GBGBGBGBGBGB
RGRGRGRGRGRG
GBGBGBGBGBGB
RGRGRGRGRGRG
GBGBGBGBGBGB

Lack of p+ implant under red pixels will not degrade red light response. The presence of the p+ layer under green and blue pixels (or neighboring pixels to red pixels) will reduce red cross talk by: (1) forming a potential barrier to the flow of electrons from the substrate, and (2) increasing recombination in the p+ layer.

Figure 1:
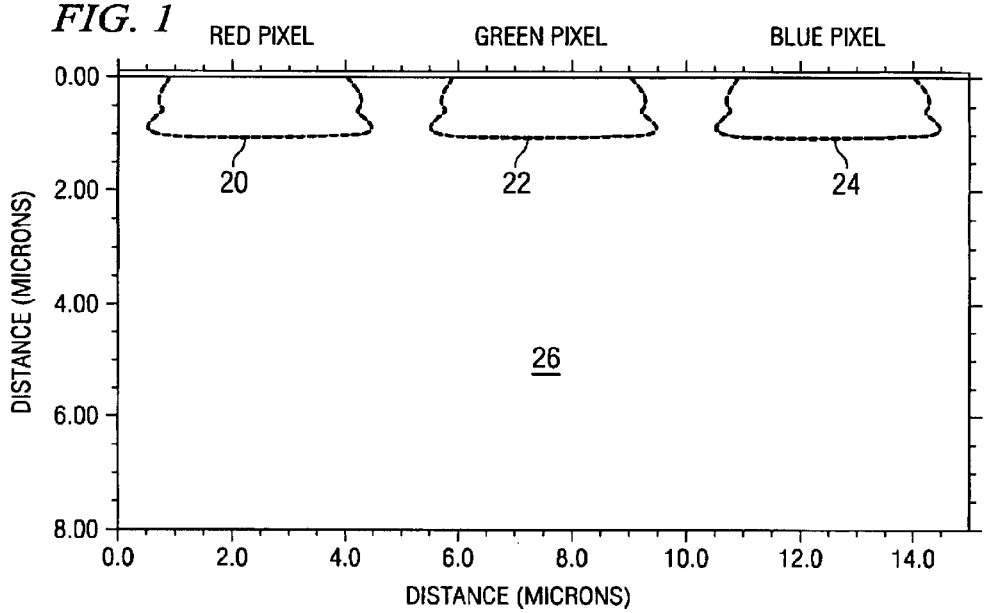
Figure 2:
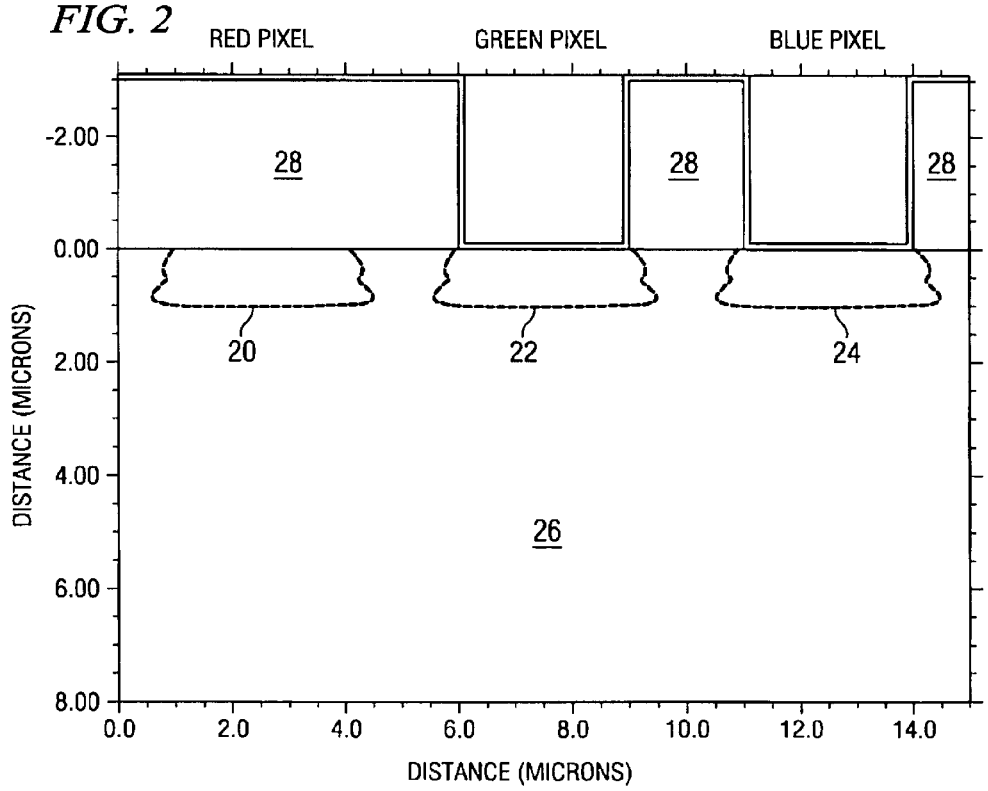

FIGS. 1–3 illustrate successive steps for forming the p+ layer implant according to a first preferred embodiment. Referring first to FIG. 1, N well regions 20, 22, and 24 are formed in P type semiconductor layer 26. N well region 20 represents a red pixel. N well region 22 represents a green pixel. N well region 24 represents a blue pixel. Next, photoresist layer 28, shown in FIG. 2, is used to pattern an implant to form deep P+ regions. This implant is done with a P type dopant such as boron. An example P+ implant is 3.0E13 B11 at 2000 keV energy with ~4 um resist thickness. P+ regions 30 and 32 are shown in FIG. 3 with the photoresist layer stripped.

FIGS. 4 and 5 illustrate successive steps for forming the p+ layer implant according to a second preferred embodiment. Photoresist layer 40, shown in FIG. 4, is used to pattern an implant to form a deep P+ region. This implant is done with a P type dopant such as boron. An example p+ implant is 3.0E13 B11 at 2000 keV energy with ~4 um resist thickness. P+ region 42 is shown in FIG. 5 with the photoresist layer stripped. The difference between the first and second embodiments is that the deep P+ region 42 in FIG. 5 is formed continuously below the green and blue pixels instead of separate P+ regions 30 and 32 in the first preferred embodiment shown in FIG. 3.

The preferred embodiments provide several advantages. The red cross talk is significantly improved without degrading red light response. Simulation results predict even an increase in the red light response due to carrier confinement at the surface layer. This invention can be implemented on process flows already designed for non-epi substrates to reduce cost. The process is scalable to 4 micron pixel sizes with 0.35 micron deep nwell rules.

One prior art method of suppressing cross talk is to use epi substrates. This reduces the impact of deeper absorbed photons by increasing the electron-hole pair recombination in the epi layer. However, gain in cross talk is obtained at the expense of reduced red light response (or longer wavelength response). This is tabulated in the tables below which show photo current and cross talk at various light wavelength and process options.

|  | Photo cur. 0.45 um (blue) | Photo cur. 0.55 um (green) | Photo cur. 0.70 um (rec) | Photo cur. 1.00 um (infrared) |
| --- | --- | --- | --- | --- |
| 3 um epi | 1.43E − 12 | 1.66E − 12 | 7.68E − 13 | 2.69E − 13 |
| 4 um epi | 1.43E − 12 | 1.69E − 12 | 8.93E − 13 | 3.28E − 13 |
| 5 um epi | 1.43E − 12 | 1.69E − 12 | 9.44E − 13 | 3.55E − 13 |
| 7 um epi | 1.43E − 12 | 1.69E − 12 | 1.06E − 12 | 4.28E − 13 |
| 20 um epi | 1.43E − 12 | 1.68E − 12 | 1.21E − 12 | 6.03E − 13 |
| ~no epi | 1.43E − 12 | 1.68E − 12 | 1.17E − 12 | 6.27E − 13 |
| OCTS | 1.42E − 12 | 1.71E − 12 | 1.40E − 12 | 8.15E − 13 (RED pixel) |
| OCTS | 1.42E − 12 | 1.63E − 12 | 8.05E − 13 | 3.30E − 13 (G/B pixel) |

|  | Cross talk 0.45 um (blue) | Cross talk 0.55 um (green) | Cross talk 0.70 um (red) | Cross talk 1.00 um (infrared) |
| --- | --- | --- | --- | --- |
| 3 um epi | 5.97E − 05 | 1.85E − 02 | 5.57E − 02 | 6.30E − 02 |
| 4 um epi | 6.68E − 05 | 4.01E − 02 | 1.65E − 01 | 1.93E − 01 |
| 5 um epi | 6.75E − 05 | 4.52E − 02 | 2.14E − 01 | 2.55E − 01 |
| 7 um epi | 6.78E − 05 | 4.95E − 02 | 3.19E − 01 | 4.03E − 01 |

-continued

|  | Cross talk 0.45 um (blue) | Cross talk 0.55 um (green) | Cross talk 0.70 um (red) | Cross talk 1.00 um (infrared) |
|---|---|---|---|---|
| 20 um epi | 6.69E − 05 | 4.77E − 02 | 4.06E − 01 | 5.79E − 01 |
| ~no epi | 6.65E − 05 | 4.63E − 02 | 3.90E − 01 | 5.95E − 01 |
| OCTS | 5.22E − 05 | 1.66E − 02 | 9.00E − 02 | 1.19E − 01 (RED pixel) |
| OCTS | 6.12E − 05 | 6.44E − 02 | 8.74E − 01 | 1.72E + 01 (G/B pixel) |

Compared to non-epi case, 3 um epi process could reduce the cross talk from 39% to 5.6% at the expense of 35% reduced red light response. However, the process described above in the preferred embodiments (OCTS=Optimal cross talk suppression) reduces cross talk to 9.00% with 20% increase in red light response.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An image sensor comprising:
   a semiconductor layer of a first conductivity type;
   a first pixel region of a second conductivity type formed in the semiconductor layer, and for detecting red light;
   a second pixel region of the second conductivity type formed in the semiconductor layer and spaced apart from the first pixel region, and for detecting green light;
   a third pixel region of the second conductivity type formed in the semiconductor layer and spaced apart from the first and second pixel regions, and for detecting blue light, wherein the first, second, and third pixel regions have equal conductivity levels; and
   a heavily doped region of the first conductivity type formed below the second pixel region and below the third pixel region, and separated from the first pixel region.

2. The device of claim 1 wherein the heavily doped region is a continuous region below the second and third pixel regions.

3. The device of claim 1 wherein the heavily doped region comprises:
   a first heavily doped area below the second pixel region; and
   a second heavily doped area below the third pixel region and separated from the first heavily doped area.

4. The device of claim 1 wherein the first conductivity type is P type and the second conductivity type is N type.

5. A semiconductor image sensing device comprising:
   a P type semiconductor layer;
   a first N type region formed in the semiconductor layer for sensing red light;
   a second N type region formed in the semiconductor layer for sensing green light;
   a third N type region formed in the semiconductor layer for sensing blue light, wherein the first, second, and third N type regions have equal conductivity levels; and
   a deep P+ region formed below the second N type region and below the third N type region, and separated from the first N type region.

6. The device of claim 5 wherein the deep P+ region is a continuous region below the second and third N type regions.

7. The device of claim 5 wherein the deep P+ region comprises:
   a first P+ region below the second N type region; and
   a second P+ region below the third N type region and separated from the first P+ region.

* * * * *